United States Patent [19]

Swain

[11] 4,330,751
[45] May 18, 1982

[54] PROGRAMMABLE FREQUENCY AND DUTY CYCLE TONE SIGNAL GENERATOR

[75] Inventor: Richard Swain, Niles, Ill.

[73] Assignee: Norlin Industries, Inc., White Plains, N.Y.

[21] Appl. No.: 99,588

[22] Filed: Dec. 3, 1979

[51] Int. Cl.³ ........................... H03K 5/04; H03K 5/26
[52] U.S. Cl. ....................................... 328/61; 328/48; 328/58; 307/265
[58] Field of Search ............................. 328/48, 58, 61; 307/265

[56] References Cited

U.S. PATENT DOCUMENTS

| | | | |
|---|---|---|---|
| 3,096,483 | 7/1963 | Ransom | 328/48 |
| 3,375,449 | 3/1968 | Ribour et al. | 328/48 |
| 3,678,398 | 7/1972 | Thomenius | 328/48 |
| 3,697,879 | 10/1972 | Holliday | 328/61 |
| 4,053,739 | 10/1977 | Miller et al. | 328/48 X |

Primary Examiner—John S. Heyman
Attorney, Agent, or Firm—Ronald J. Kransdorf; Jack Kail

[57] ABSTRACT

Apparatus for generating an output signal having a frequency and duty cycle controllable in response to a pair of binary control words. The apparatus includes a pair of counters which are alternately enabled for counting high frequency clock pulses for respective time durations determined according to the two binary control words. A bi-stable device is controlled by the counters for developing the output signal which alternates between two levels for time durations corresponding to the time periods during which the two counters are enabled. The frequency and duty cycle of the output signal are therefore controllable by suitably adjusting the values of the two binary control words.

1 Claim, 2 Drawing Figures

PROGRAMMABLE FREQUENCY AND DUTY CYCLE TONE SIGNAL GENERATOR

BACKGROUND OF THE INVENTION

This invention relates generally to signal generators of the type producing a rectangular output signal having a controllable duty cycle and frequency and, more particularly, relates to such signal generators which are digitally programmable and suited for use in association with an electronic musical instrument.

In a conventional electronic musical instrument, such as an electronic organ or the like, tone signals are typically generated in the form of rectangular waves having selected frequencies and duty cycles. Varying the frequency of such a tone signal affects the pitch of the produced sound while adjustment of the duty cycle allows for the creation of different types of orchestral sounds which are characterized by different harmonic structures. For example, experience has shown that a tone signal with a 50% duty cycle is useful for producing a clarinet-type sound whereas a tone signal having a 12.5% duty cycle is useful for producing a string-type sound. For a number of reasons, the electronic musical instrument art has in addition recently experienced a trend in the direction of digital tone signal generation. It would therefore be highly useful to provide a tone signal generator for digitally producing a rectangular wave audio tone signal whose frequency and duty cycle are both selectively controllable. Moreover, it is preferable that such a digital tone signal generator be controllable in response to suitable digital programming inputs.

SUMMARY OF THE INVENTION

It is accordingly a basic object of the present invention to provide a digital tone signal generator capable of producing rectangular wave tone signals having frequencies and duty cycles determined according to digital programming inputs.

In accordance with the foregoing, the tone signal generator of the present invention comprises a pair of binary counters each enableable for being clocked in response to a high frequency clock source and each having a respective binary control word coupled to its preset input, one of the binary control words defining, in association with the high frequency clock signal, the duration of a first half-cycle of each period of a tone signal and the other binary control word defining, in association with the high frequency clock signal, the duration of the remaining half-cycle of each period of the tone signal. The tone signal is produced at the output of a bi-stable device which is connected for changing state in response to either of the counters achieving a predetermined count, e.g. a zero count, whereby that counter is reloaded while the other counter is enabled. As a consequence, a rectangular tone signal is produced having a first level whose time duration is determined by one of the binary control words and a second level whose time duration is determined by the other binary control signal. Adjusting the values of the two binary control words therefore provides a convenient means by which the frequency and duty cycle of the tone signal may be controlled.

DESCRIPTION OF THE PREFERRED EMBODIMENT

Figure 1:
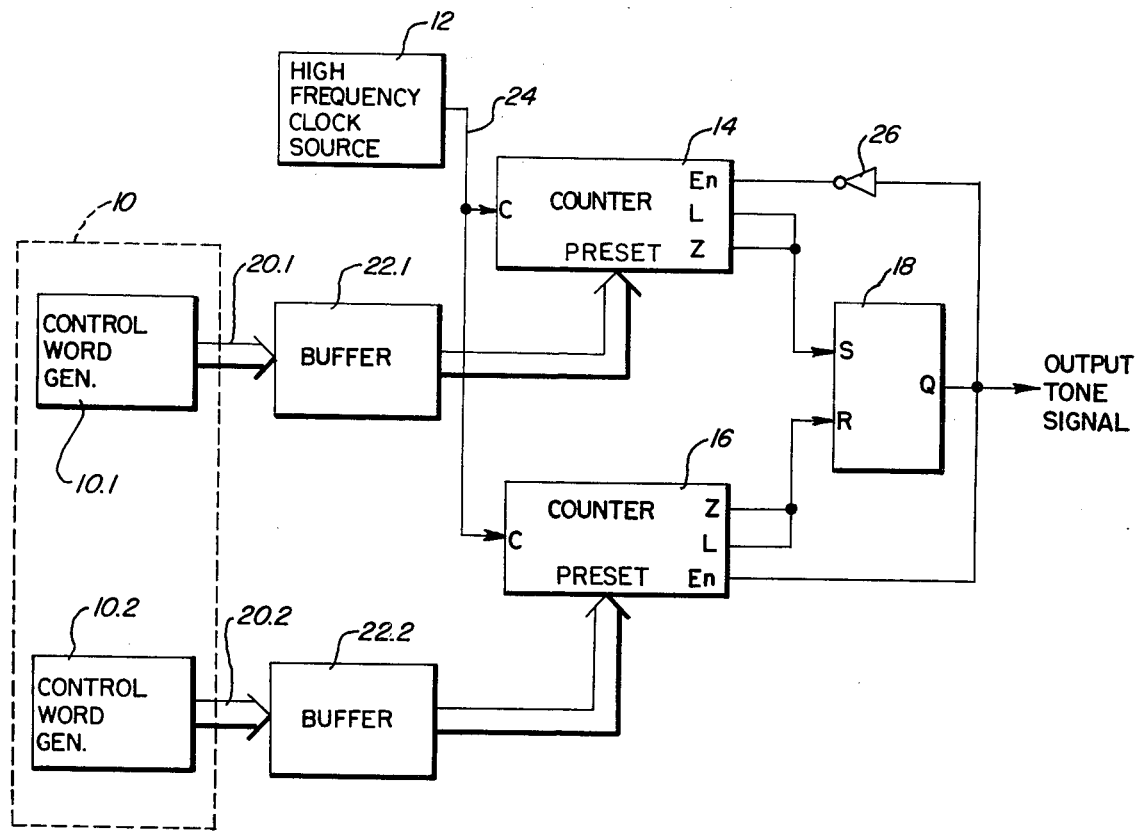
FIG. 1 is an electrical block diagram of a preferred form of the tone signal generator of the invention.

Referring to FIG. 1, a preferred form of the tone generator of the invention essentially comprises a binary control word generator 10, a high frequency clock source 12, a pair of binary counters 14 and 16 and an output R-S flip-flop 18. The foregoing identification of circuit elements should be interpreted in a functional sense and not as imposing any specific limitations on the invention. Thus, for example, any circuit element or combination of circuit elements, capable of realizing the function performed by a binary counter, e.g. a linear feedback shift register, should be considered as equivalent to and contemplated by the counters 14 and 16.

The control word generator 10 may comprise any type of binary control circuit capable of selectively developing a pair of adjustable binary control words either directly in response to operator manipulable controls or, for example, in response to the output of some ancillary control apparatus. In fact, the control word generator 10 may be embodied within an ancillary control apparatus such as in the case of a microprocessor controller. For purposes of clarity, the control word generator 10 is illustrated as comprising a pair of generators 10.1 and 10.2 each coupling an adjustable binary control word to a respective multiconductor output bus 20.1 and 20.2. Bus 20.1 is connected through a buffer register 22.1 to the preset inputs of counter 14 and bus 20.2 is connected through a second buffer register 22.2 to the preset inputs of counter 16. Each of the buffers 22.1 and 22.2 provides sufficient storage capacity for storing the respective binary control words presented thereto by buses 20.1 and 20.2 so that the control word generator 10 may be used for some other purpose while the control word information is retained in the buffers.

Each of the counters 14 and 16 receive a clock input comprising a series of clock pulses developed on a line 24 derived from the output of the high frequency clock source 12. Each of the counters 14 and 16 further includes a load input L, energization of which results in the counter being preset to the value represented by the binary control word stored in its respective buffer register 22.1 or 22.2, an enable input EN and a control output Z coupled directly to the load input L. In response to a suitable logic signal supplied to its enable input EN, each of the counters 14 and 16 is operable for counting down from its respective preset value to zero whereupon a control signal is developed at its control output Z.

A bi-stable device in the form of RS flip-flop 18 includes a set input S connected to the control output Z of the counter 14 and a reset input R connected to the control output Z of the counter 16. The flip-flop 18 is therefore operable for assuming its Q=1 state in response to a control signal developed at the control output Z of the counter 14 and for assuming its Q=0 state in response to a control signal developed at the control output Z of the counter 16. The Q output of the flip-flop 18, at which is developed the output tone signal of the tone generator, is coupled directly to the enable input EN of the counter 16 and through an inverter 26 to the enable input EN of the counter 14. Thus, the Q output of flip-flop 18 is effective for enabling one of the counters 14 and 16 at a time depending upon the state of the flip-flop, counter 16 being enabled when the flip-flop is in its Q=1 state and counter 14 being enabled when the flip-flop is in its Q=0 state.

Figure 2:
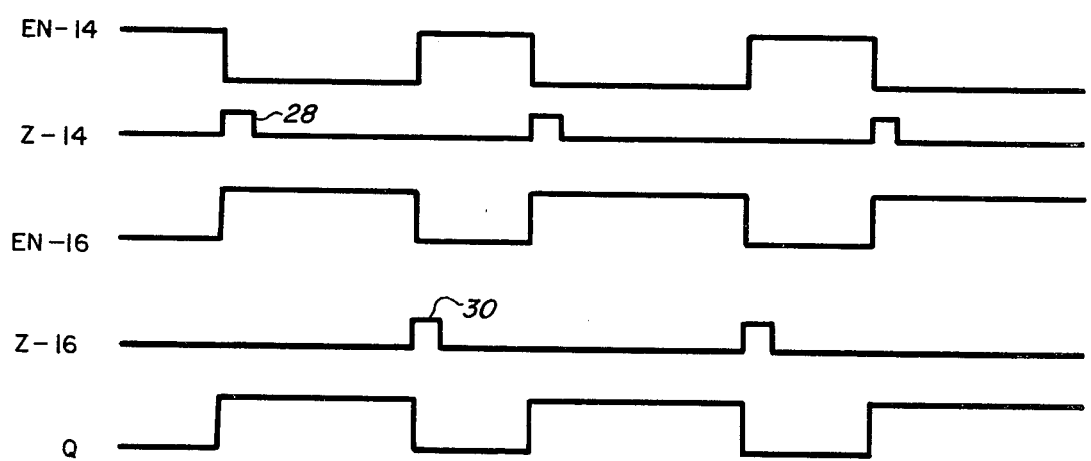
FIG. 2 depicts several waveform diagrams useful in explaining the operation of the tone signal generator of FIG. 1.

Referring to FIG. 2, a series of waveform diagrams are illustrated useful in explaining the operation of the tone signal generator shown in FIG. 1. The first waveform, labeled EN-14, represents the signal supplied to the enable input EN of counter 14, the second waveform labeled Z-14, the control signal developed at the control output Z of counter 14, the third waveform, labeled EN-16, the signal supplied to the enable input EN of counter 16 and the fourth waveform, labeled Z-16, the control signal developed at the control output Z of counter 16. The final waveform, labeled Q, represents the signal developed at the Q output of flip-flop 18.

Assume initially that the flip-flop 18 is in its Q=0 state and that the counter 14 has been preset to the value corresponding to the control word stored in buffer register 22.1, which value will be represented herein by N1. Accordingly, the counter 14 is placed in its enabled condition, EN−14=1, while counter 16 is disabled, EN−16=0. The counter 14 will begin counting the high frequency clock pulses appearing on the output line 24 of master oscillator 12 from the preset value N1 toward zero. Upon achieving a zero count, a pulse 28 is developed at the control output Z of the counter 14 which sets the flip-flop 18 to its Q=1 state and causes the binary control word N1 stored in the buffer register 22.1 to be reloaded into the counter 14. Now, the Q=1 output of the flip-flop 18 enables the counter 16 and disables the counter 14. The counter 16 consequently begins counting the high frequency clock pulses appearing on line 24 from its preset value corresponding to the contents of buffer register 22.2, which value will be represented herein by N2, toward zero. Upon achieving a zero count, a pulse 30 is developed at the control output Z of the counter 16 which resets the flip-flop 18 to its Q=0 state and causes the binary control word N2 stored in the buffer register 22.2 to be reloaded into the counter 16. The foregoing process is continuously repeated with the counters 14 and 16 being alternately enabled for counting N1 and N2 of the high frequency clock pulses as the flip-flop continuously switches between its Q=0 and its Q=1 states.

In accordance with the above explanation, it will be observed that the Q output of flip-flop 18 comprises a periodic rectangular wave signal whose logical transitions are determined by the values of the binary control words N1 and N2. In particular, each period of the signal is characterized by a logically high first half-cycle portion whose duration corresponds to the period of the clock signal appearing on line 24 multiplied by N2. Similarly, the second half-cycle of each period of the output signal comprises a logically low portion whose duration corresponds to the period of the clock signal appearing on line 24 multiplied by N1. As a consequence, the frequency of the output signal is given by the expression $F=Fc/(N1+N2)$, where Fc is the frequency of the master oscillator 12. Also, the duty cycle of the output signal is given by the expression $DC=N1/(N1+N2)$. Thus, either the frequency or the duty cycle of the output tone signal may be conveniently adjusted or controlled by suitably varying the values N1 and N2 of the binary control words developed by the control word generator 10.

What has thus been shown is an improved tone signal generator operable in response to binary programming information for generating an output tone signal whose frequency and duty cycle are both conveniently controllable.

While the foregoing embodiment of the invention is preferred at the present time, and represents the best known mode of carrying out the concepts of the invention, it is to be understood that it is presented for purposes of illustration only, and not intended to limit the scope of protection which is more broadly stated in the following claims.

What is claimed is:

1. Apparatus for generating an output signal having a controllable duty cycle and frequency comprising:

first and second control means adapted for selectively generating respective first and second different multibit control words each representing the desired duration of a respective half-cycle of said output signal;

oscillator means for generating a clock signal comprising a sequence of clock pulses;

first and second presettable down counting means each having a clock input receiving said clock signal, a preset input receiving a respective one of said first and second control words from said first and second control means, an enable input and a load input, each of said first and second counting means further including a control output developing a control signal in response to the associated counting means assuming a zero count, the control output of each of said counting means being connected to its respective load input;

bi-stable means having a set input, a reset input and an output; and circuit means coupling the load input and control output of said first counting means to the set input of said bi-stable means and the load input and control output of said second counting means to the reset input of said bi-stable means, said circuit means further coupling the output of said bi-stable means in non-inverted form to the enable input of one of said counting means and in inverted form to the enable input of the other of said counting means, whereby said output signal is developed in the form of a continuous succession of logically high and low signal states at the output of said bi-stable means.

* * * * *